United States Patent
Cowen et al.

(10) Patent No.: US 6,229,684 B1
(45) Date of Patent: May 8, 2001

(54) VARIABLE CAPACITOR AND ASSOCIATED FABRICATION METHOD

(75) Inventors: Allen Bruce Cowen, Morrisville; Vijayakumar Rudrappa Dhuler, Raleigh; Edward Arthur Hill, Chapel Hill; David Alan Koester, Burlington; Ramaswamy Mahadevan, Chapel Hill, all of NC (US)

(73) Assignee: JDS Uniphase Inc. (CA)

( * ) Notice: Subject to any disclaimer, the term of this patent is extended or adjusted under 35 U.S.C. 154(b) by 0 days.

(21) Appl. No.: 09/461,247

(22) Filed: Dec. 15, 1999

(51) Int. Cl.[7] ........................................ H01G 5/01
(52) U.S. Cl. .................. 361/278; 361/277; 361/298.2
(58) Field of Search ................................. 361/277, 278, 361/281–282, 299.5, 298.2, 298.4, 298.5, 290

(56) References Cited

U.S. PATENT DOCUMENTS

| | | |
|---|---|---|
| 3,646,413 | 2/1972 | Oomen . |
| 3,796,976 | 3/1974 | Heng et al. ........................ 333/84 M |
| 4,141,080 | 2/1979 | Paul et al. ............................... 365/87 |
| 4,244,722 | 1/1981 | Tsuya et al. ............................. 65/32 |
| 4,480,254 | 10/1984 | Spencer et al. ........................ 343/708 |

(List continued on next page.)

Primary Examiner—Anthony Dinkins
(74) Attorney, Agent, or Firm—Myers Bigel Sibley & Sajovec (57) ABSTRACT

A variable capacitor having low loss and a correspondingly high Q is provided. In addition to a substrate, the variable capacitor includes at least one substrate electrode and a substrate capacitor plate that are disposed upon the substrate and formed of a low electrical resistance material, such as HTS material or a thick metal layer. The variable capacitor also includes a bimorph member extending outwardly from the substrate and over the at least one substrate electrode. The bimorph member includes first and second layers formed of materials having different coefficients of thermal expansion. The first and second layers of the bimorph member define at least one bimorph electrode and a bimorph capacitor plate such that the establishment of a voltage differential between the substrate electrode and the bimorph electrode moves the bimorph member relative to the substrate electrode, thereby altering the interelectrode spacing as well as the distance between the capacitor plates. As such, the capacitance of the variable capacitor can be controlled based upon the relative spacing between the bimorph member and the underlying substrate. A method is also provided for micromachining or otherwise fabricating a variable capacitor having an electrode and a capacitor plate formed of a low electrical resistance material such that the resulting variable capacitor has low loss and a correspondingly high Q. The variable capacitor can therefore be employed in high frequency applications, such as required by some tunable filters.

33 Claims, 10 Drawing Sheets

U.S. PATENT DOCUMENTS

| | | | |
|---|---|---|---|
| 4,516,091 | 5/1985 | Sasser | 333/161 |
| 4,554,519 | 11/1985 | Adam | 333/141 |
| 4,619,001 | 10/1986 | Kane | 455/192 |
| 4,692,727 | 9/1987 | Wakino et al. | 333/219 |
| 4,782,313 | 11/1988 | Brant, Jr. | 333/246 |
| 4,849,722 | 7/1989 | Cruchon et al. | 333/205 |
| 4,853,660 | 8/1989 | Schloemann | 333/204 |
| 5,075,600 | 12/1991 | El-Hamamsy et al. | 315/248 |
| 5,162,977 | 11/1992 | Paurus et al. | 361/401 |
| 5,164,688 | 11/1992 | Larson | 333/33 |
| 5,168,249 | 12/1992 | Larson | 200/181 |
| 5,258,591 | 11/1993 | Buck | 333/81 A |
| 5,312,790 | 5/1994 | Sengupta et al. | 501/137 |
| 5,367,136 | 11/1994 | Buck | 200/600 |
| 5,406,233 | 4/1995 | Shih et al. | 333/161 |
| 5,467,067 | 11/1995 | Field et al. | 335/4 |
| 5,479,042 | 12/1995 | James et al. | 257/415 |
| 5,504,466 | 4/1996 | Chan-Son-Lint et al. | 333/159 |
| 5,543,765 | 8/1996 | Cachier | 333/246 |
| 5,568,106 | 10/1996 | Fang et al. | 333/204 |
| 5,578,976 | 11/1996 | Yao | 333/262 |
| 5,587,943 | 12/1996 | Torok et al. | 365/158 |
| 5,589,845 | 12/1996 | Yandrofski et al. | 343/909 |
| 5,607,631 | 3/1997 | Wolfson et al. | 264/61 |
| 5,640,042 | 6/1997 | Koscica et al. | 257/595 |
| 5,640,133 | 6/1997 | MacDonald et al. | 333/197 |
| 5,677,823 | 10/1997 | Smith | 361/234 |
| 5,696,662 | 12/1997 | Bauhahn | 361/298.1 |
| 5,721,194 | 2/1998 | Yandrofski et al. | 505/210 |
| 5,770,546 | 6/1998 | Grothe et al. | 505/210 |
| 5,808,527 | 9/1998 | De Los Santos | 333/205 |
| 5,818,683 | 10/1998 | Fujii | 361/277 |
| 5,830,591 | 11/1998 | Sengupta et al. | 428/701 |
| 5,834,975 | 11/1998 | Barlett et al. | 330/278 |
| 5,870,007 | 2/1999 | Carr et al. | 333/262 |
| 5,870,274 | 2/1999 | Lucas | 361/311 |
| 5,872,489 | 2/1999 | Chang et al. | 331/179 |
| 5,880,921 | 3/1999 | Tham et al. | 361/233 |
| 5,912,472 | 6/1999 | Voiglaender et al. | 257/31 |
| 5,912,486 | 6/1999 | Summerfelt | 257/310 |
| 5,914,553 | 6/1999 | Adams et al. | 310/309 |
| 5,925,455 | 7/1999 | Bruzzone et al. | 428/328 |
| 5,926,073 | 7/1999 | Hasegawa et al. | 333/1.1 |
| 5,930,165 | 7/1999 | Johnson et al. | |
| 6,057,520 * | 5/2000 | Goodwin-Johansson | 200/181 |

* cited by examiner

VARIABLE CAPACITOR AND ASSOCIATED FABRICATION METHOD

FIELD OF THE INVENTION

The present invention relates generally to variable capacitors and associated fabrication methods and, more particularly, to microelectromechanical system (MEMS) variable capacitors having a high Q and associated fabrication methods.

BACKGROUND OF THE INVENTION

Microelectromechanical structures (MEMS) and other microengineered devices are presently being developed for a wide variety of applications in view of the size, cost and reliability advantages provided by these devices. For example, one advantageous MEMS device is a variable capacitor in which the interelectrode spacing between a pair of electrodes is controllably varied in order to selectively vary the capacitance between the electrodes. In this regard, conventional MEMS variable capacitors include a pair of electrodes, one of which is typically disposed upon and fixed to the substrate and the other of which is typically carried on a movable actuator or driver. In accordance with MEMS technology, the movable actuator is typically formed by micromachining the substrate such that very small and very precisely defined actuators can be constructed.

While a variable capacitor can be utilized for many applications, tunable filters frequently utilize variable capacitors in order to appropriately tune the filter to pass signals having predetermined frequencies, while rejecting signals having other frequencies. For tunable filters that are utilized for high frequency applications, such as applications involving radio frequency (RF) signals, the tunable filter preferably has a low loss and a high Q, i.e., a high quality factor. Unfortunately, variable capacitors that include electrodes formed of conventional metals generally do not have a sufficiently high Q for high frequency applications. While electrodes formed of superconducting materials would advantageously increase the Q of the resulting variable capacitor, the use of superconducting materials is generally not compatible with the micromachining techniques, such as required to fabricate the actuator of a conventional MEMS variable capacitor. For example, the chemicals, i.e., the etchants, utilized during the micromachining of a substrate would likely harm the acid and water sensitive superconducting materials. In addition, the elevated temperatures, in the range of 400° C. or greater, required for conventional micromachining will cause damage to the temperature-sensitive superconducting materials.

As such, MEMS variable capacitors that have improved performance characteristics are desired for many applications. For example, tunable filters having a higher Q so as to be suitable for filtering high frequency signals are desirable, but are currently large in size, expensive to fabricate and have limited performance characteristics.

SUMMARY OF THE INVENTION

A variable capacitor is therefore provided that is micromachined so as to be precisely defined and extremely small, while also including electrodes formed of a low electrical resistance material. As such, the variable capacitor can be utilized for a wide variety of high performance applications including use as a tunable filter having a high Q. As such, the tunable filter can appropriately filter high frequency signals, such as radio frequency and microwave signals.

The variable capacitor includes a substrate and at least one substrate electrode formed of a low electrical resistance material, such as a high temperature superconducting (HTS) material or a thick metal layer, that is disposed upon the substrate. The variable capacitor also includes a bimorph member extending outwardly from the substrate and over the at least one substrate electrode. The bimorph member includes first and second layers formed of materials having different coefficients of thermal expansion. The first and second layers of the bimorph member define at least one bimorph electrode such that the establishment of a voltage differential between the substrate electrode and the bimorph electrode moves the bimorph member relative to the substrate electrode, thereby altering the interelectrode spacing. As such, the bimorph member serves as the actuator in order to controllably move the bimorph electrode relative to the fixed substrate electrode.

The variable capacitor can also include a substrate capacitor plate disposed upon the substrate. Preferably, the substrate capacitor plate is also formed of a low electrical resistance material, such as a HTS material or a thick metal layer. The bimorph member also preferably defines a bimorph capacitor plate that moves with the bimorph member in response to the voltage differential between the substrate and bimorph electrodes to thereby correspondingly alter the capacitance between the substrate and bimorph capacitor plates. By therefore selectively establishing a voltage differential between the substrate and bimorph electrodes, the bimorph member can be moved relative to the underlying substrate such that the spacing between the substrate and bimorph capacitor plates and the resulting capacitance established therebetween is selectively altered.

In one embodiment, the bimorph member defines the bimorph electrode and the bimorph capacitor plate as one continuous conductive layer of the bimorph member. As such, the one single conductive layer serves as both the bimorph electrode and the bimorph conductive plate. In another embodiment, the bimorph member defines the bimorph electrode and the bimorph capacitor plate to be discrete components. In particular, the bimorph member preferably defines the bimorph electrode to be in general alignment with the substrate electrode. In addition, the bimorph member of this embodiment preferably defines the bimorph capacitor plate to be spaced from the bimorph electrode and disposed in general alignment with the substrate capacitor plate.

The bimorph member can be fabricated from a variety of materials. For example, the first layer of the bimorph member can include a metal, such as gold, and the second layer of the bimorph member can include a metal, such as aluminum. Typically, the materials chosen for the layers of the bimorph member will have disparate coefficients of thermal expansion to facilitate proper thermal actuation of the bimorph member. Alternatively, the first layer of the bimorph member can include a dielectric material, such as silicon nitride, silicon oxide or a suitable polymer and the second layer of the bimorph member can include a metal, such as gold. The materials that form the first and second layers are preferably selected such that the bimorph member curls away from the substrate at a predetermined operating temperature in the absence of an applied voltage as a result of the different coefficients of thermal expansion of the materials that form the first and second layers of the bimorph member. As such, by appropriately applying voltages to the substrate and bimorph electrodes, the bimorph member can therefore be at least partially uncurled in order to control the spacing between the substrate capacitor plate and the bimorph capacitor plate.

A method of fabricating a variable capacitor is also provided according to another aspect of the present invention. In this regard, a low electrical resistance material, such as a HTS material, is initially deposited upon the substrate to define at least one substrate electrode and, more preferably, both the substrate electrode(s) and the substrate capacitor plate. Optionally, a dielectric layer may be disposed on the at least one substrate electrode and substrate capacitor plate to provide electrical insulation, as needed. Thereafter, a sacrificial layer, preferably formed of low temperature oxide, metal, or photoresist, is deposited over the substrate electrode, the substrate capacitor plate and the optional dielectric layer. A bimorph member that includes a bimorph electrode and, more preferably, both a bimorph electrode and a bimorph capacitor plate is then formed on at least a portion of the sacrificial layer and within a window through the sacrificial layer through which the underlying substrate is exposed. As such, the bimorph member extends outwardly from the substrate and over the substrate electrode(s) and the substrate capacitor plate. Once the bimorph member has been formed, the sacrificial layer is removed such that the bimorph member curls upwardly and is movable relative to the underlying substrate, the substrate electrode and the substrate capacitor plate in response to a voltage differential between the substrate and bimorph electrodes.

According to one embodiment, the bimorph member is formed by depositing a first layer upon the sacrificial layer and within the window through the sacrificial layer through which the underlying substrate is exposed. Thereafter, a second layer is deposited upon the first layer with the first and second layers selected such that the second layer has a different coefficient of thermal expansion than the first layer. In one embodiment, the deposition of the second layer can include the deposition of a continuous second layer upon the first layer such that the continuous second layer serves as both the bimorph electrode and the bimorph capacitor plate. Alternatively, the deposition of the second layer includes forming at least one bimorph electrode upon the first layer and disposed in general alignment with the at least one substrate electrode. In addition to forming the at least one bimorph electrode, the deposition of the second layer can include a bimorph capacitor plate that is spaced from the at least one bimorph electrode and is disposed in general alignment with the substrate capacitor plate.

According to the present invention, a variable capacitor and an associated fabrication method are provided which permit micromachining techniques to be utilized to fabricate a variable capacitor having an electrode and a capacitor plate formed of a low electrical resistance material, such as HTS material. As such, the variable capacitor can be precisely defined and can have a small size, while also having improved performance characteristics relative to conventional variable capacitors. As a result, the variable capacitors can be used in a variety of applications, including use as tunable filters having a relatively high Q. Since a tunable filter including the variable capacitor of the present invention has a relatively high Q, the tunable filter can be used for filtering signals having high frequencies, such as signals having radio frequencies.

DETAILED DESCRIPTION OF THE PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
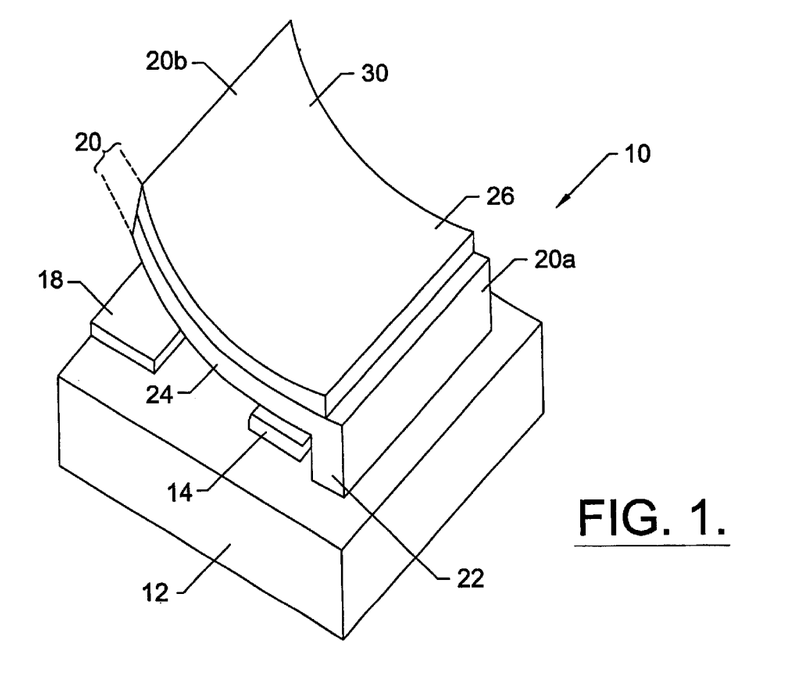
FIG. 1 is a perspective view of a variable capacitor according to one embodiment of the present invention.

Referring now to FIG. 1, a variable capacitor 10 according to one embodiment of the present invention is illustrated. The variable capacitor includes a microelectronic substrate 12. In order to permit components formed of a superconducting material to be formed upon the substrate, the substrate preferably has a high dielectric constant, low loss tangent and a coefficient of thermal expansion (CTE) that is similar to the CTE of the capacitor and electrode materials. For example, if compatibility with High Temperature Superconductive (HTS) materials is desired, the substrate can be formed of magnesium oxide (MgO) or other similar materials, such as $LaAlO_3$ or $NdCaAlO_4$ may be used. If the electrodes and capacitor plates are formed of non-HTS materials, the substrate can be formed of quartz, sapphire, or other suitable substrate materials.

Figure 2:
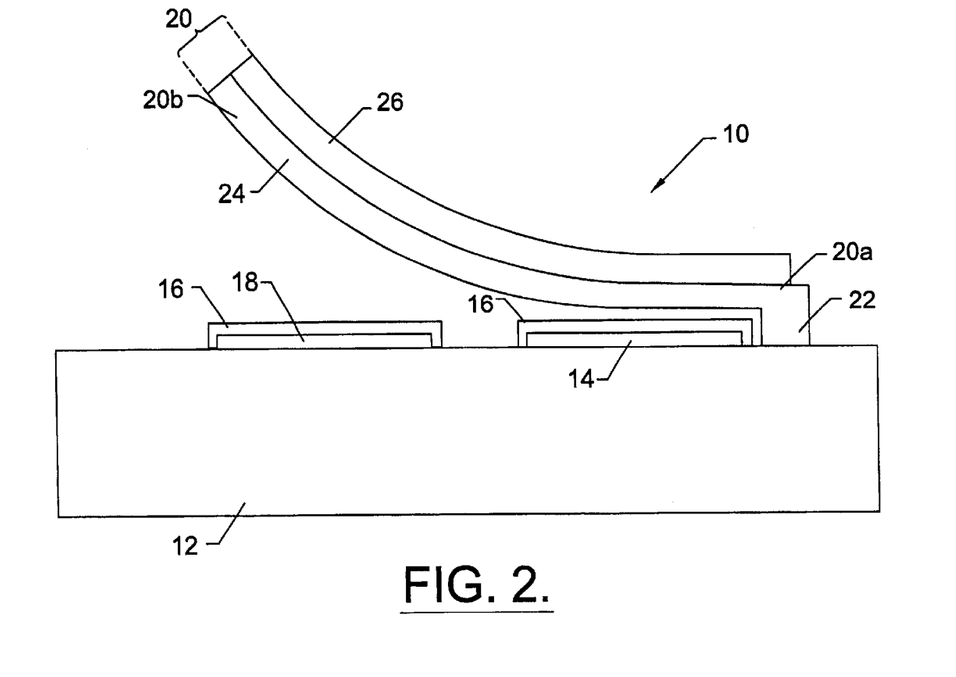
FIG. 2 is a cross-sectional side view of the variable capacitor of FIG. 1.

As shown more clearly in FIG. 2, the variable capacitor 10 also includes at least one substrate electrode 14 disposed upon the substrate 12. Although the variable capacitor can include a plurality of substrate electrodes disposed upon the substrate, the variable capacitor will be hereinafter described in the context of a variable capacitor having a single substrate electrode for purposes of illustration. In order to increase the Q of the resulting variable capacitor, the substrate electrode is formed of a material having low electrical resistance at the frequencies of interest.

In one preferred embodiment of the invention the substrate electrode is formed of a high temperature superconducting (HTS) material. Although various HTS materials can be utilized, the substrate electrode of one advantageous embodiment is formed of Yttrium Barium Copper Oxide (YBCO) or Thallium Barium Calcium Copper Oxide (TBCCO).

Figure 3:
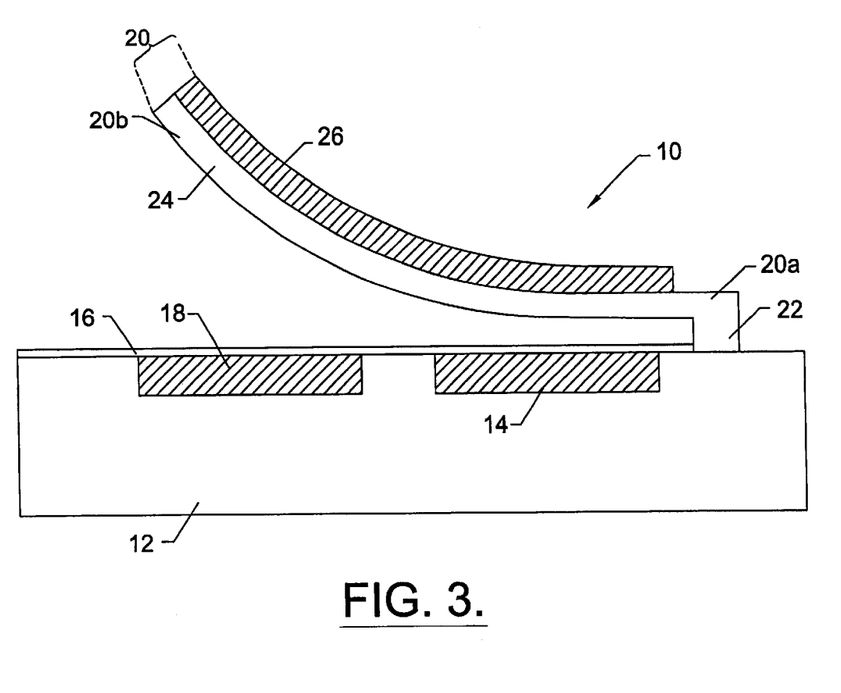
FIG. 3 is a cross-sectional view of a variable capacitor having the substrate electrode and substrate capacitor plate countersunk into the substrate in according with another embodiment of the present invention.

In an alternate embodiment the substrate electrode may comprise a thick metal layer, such as a thick layer of gold. In order to reduce losses, the metal layer must be several times the skin depth of the traversing signal at the frequency of capacitor operation. A thick layer of metal will assure low electrical resistance and allow for conductance of the frequencies of interest. Preferably, the thickness of the metal layer will be at least two times (2×) the skin depth of the traversing signal at the frequency of operation. For example at about 850 MHz, the skin depth is approximately 2 micrometers and the corresponding substrate electrode will have a thickness of about 4 micrometers to about 6 micrometers. Electrodes having such a prominent thickness create severe surface topography in the capacitor device and pose difficulty in fabricating the later formed layers in the capacitor construct. To overcome this problem, the substrate electrode may be countersunk into the substrate by depositing the thick metal layer in a trench. FIG. 3 illustrates a cross-sectional view of the variable capacitor that has countersunk into the substrate 12 a substrate electrode 14 (and substrate capacitor plate 18) in accordance with an embodiment of the present invention. The countersinking of the substrate electrode and substrate capacitor plate creates a planar surface for the subsequent protective film 16.

As also shown in FIGS. 2 and 3, a protective dielectric layer 16 optionally covers the substrate electrode 14. As described hereinafter in conjunction with a discussion of a method for fabricating the variable capacitor 10, a dielectric layer is preferably used to cover the substrate electrode in the embodiments in which the substrate electrode is formed of HTS material. The protective nature of the dielectric layer serves to shield the HTS material during the subsequent fabrication steps. In particular, the dielectric layer protects the HTS material from the chemicals utilized during the fabrication process, such as the etchants. As such, the dielectric layer is typically formed of a material that is resistant to the chemicals utilized during the fabrication process, while also, typically, being a low loss dielectric material. In this regard, the dielectric nature of the material serves to electrically isolate the substrate electrode from the bimorph member. In addition, the dielectric layer will typically be a relatively thin film, typically, having a thickness less than about 1 micrometer. In an embodiment that utilizes HTS to form the electrodes the dielectric layer may comprise a polymeric material or another material suitable for providing protection to the HTS material.

In other embodiments that utilize non-HTS substrate electrode(s) the dielectric layer 16 may be omitted. In non-HTS substrate electrode embodiments the protective nature of the dielectric layer is not as critical. If a dielectric layer is used in non-HTS electrode embodiments it is typically employed for the insulating characteristics. As such the dielectric layer in the non-HTS substrate electrode embodiments may comprise an oxide or other suitable dielectric materials. If the dielectric layer is omitted and, thus, air serves as the dielectric, some other type of dielectric element or isolated standoffs will typically be present in the variable capacitor to prevent shorting of the substrate electrode and the bimorph electrode.

In addition to the substrate electrode 14, the variable capacitor 10 also includes a substrate capacitor plate 18 disposed upon the substrate 12. Like the substrate electrode, the substrate capacitor plate is preferably formed of a material exhibiting low electrical resistance at the frequencies of interest. As such, the substrate capacitor plate is also preferably formed of a HTS material, such as YBCO or TBCCO. Additionally, the substrate capacitor plate may comprise a thick metal layer, such as a thick layer of gold. As described above, the thick metal layer must be several times the skin depth of the traversing signal at the frequency of capacitor operation. Preferably, the thickness of the metal layer will be at least two times (2×) the skin depth of the traversing signal at the frequency of operation. As shown in FIG. 3, in thick metal capacitor plate embodiments the substrate capacitor plate 18 may be countersunk into the substrate 12 to alleviate problems related to topography.

Figure 4A:
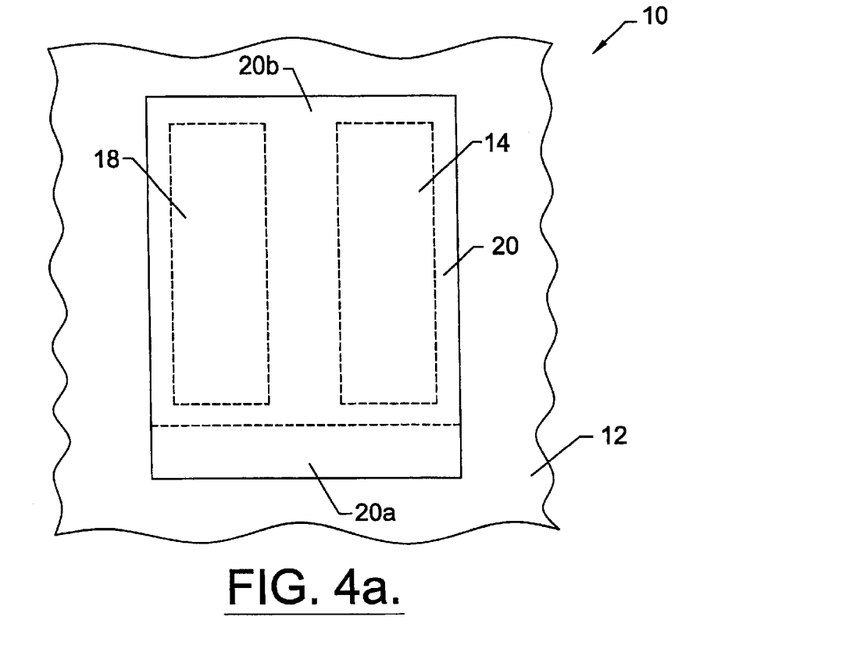
FIGS. 4a–4b are plan views of the variable capacitor depicting two variations of substrate electrode and substrate capacitor plate configuration and shape, in accordance with an embodiment of the present invention.
Figure 4B:
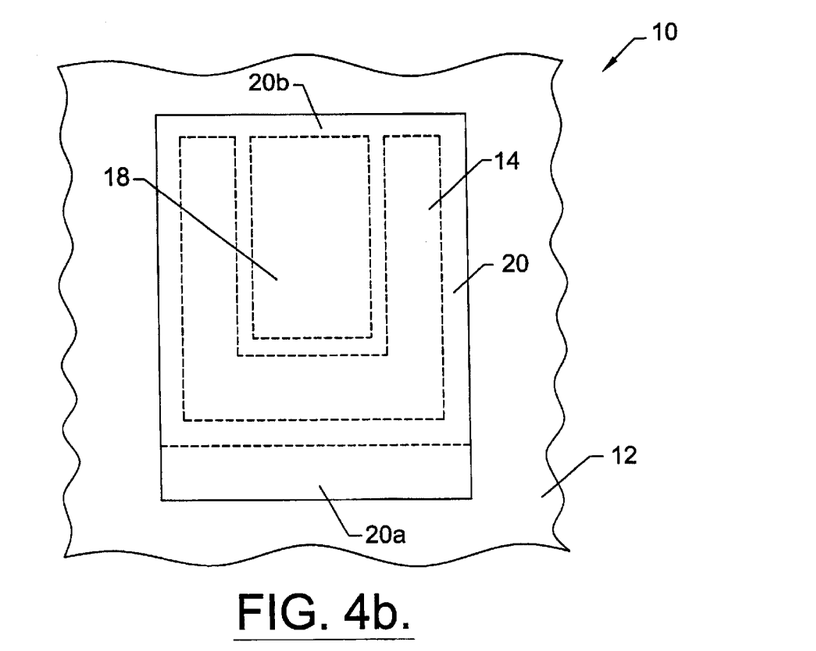

In embodiments in which the substrate electrode and the substrate capacitor plate are formed of the same material, such as YBCO, TBCCO or a thick layer of gold, the processing of these components can be accomplished in the same fabrication step(s). As shown in FIGS. 2 and 3, the substrate capacitor plate is preferably spaced apart from the substrate electrode. In addition, while the substrate capacitor plate and the substrate electrode are illustrated to be approximately the same size and shape, the substrate capacitor plate and the substrate electrode can have different sizes and shapes without departing from the spirit and scope of the present invention. By varying the shape and configuration of the substrate electrode and substrate capacitor plate it is possible to provide for uniform actuation force across the entirety of the bimorph member 20. FIGS. 4a and 4b depict plan views of the variable capacitor 10 detailing alternate shapes and configurations of the substrate electrode and substrate capacitor plate. As shown in FIG. 4a, a preferred embodiment of the substrate electrode and capacitor plate configuration shows the substrate electrode 14 disposed on the substrate 12 lengthwise from an area proximate the fixed portion 20a of the subsequently formed bimorph member 20 to an area proximate the farthest reach of the distal portion 20b of the bimorph member. The substrate capacitor plate 18 is disposed adjacent to the substrate electrode in similar lengthwise fashion. As shown in FIG. 4b, the substrate electrode 14 is U-shaped having the base of the U-shape proximate the fixed portion 20a of the bimorph member 20 and the substrate capacitor plate disposed on the substrate such that it is enclosed on three sides by the U-shaped substrate electrode. Both of these embodiments, as well as other conceivable configuration and shape embodiments are used to insure uniform actuation force is applied across the entire surface of the bimorph member.

As described above, in conjunction with the substrate electrode, a substrate capacitor plate that is formed of a HTS material is also preferably covered with a protective dielectric layer 16 to protect the substrate capacitor plate from the chemicals employed during the fabrication process and to provide for a dielectric. For example, the substrate capacitor plate can be coated with a protective dielectric film of polyimide or another suitable dielectric material. In embodiments in which both the substrate electrode and the substrate capacitor plate are formed of HTS material the dielectric layer may be disposed in the same processing step(s). In embodiments in which the substrate capacitor plate is formed of non-HTS materials the dielectric layer 16 may be omitted. If a dielectric layer is used in non-HTS capacitor plate embodiments it may comprise an oxide material or another suitable dielectric material. If the dielectric layer is omitted and, thus, air serves as the dielectric, some other type of dielectric element or isolated standoffs will typically be present in the variable capacitor to prevent shorting of the substrate electrode and the bimorph electrode.

As shown in FIGS. 1 and 2, the variable capacitor 10 also includes a bimorph member 20 that is controllably moveable relative to the underlying substrate 12 and, therefore, relative to the substrate capacitor plate 18 disposed upon the substrate. The proximal end 20a of the bimorph member is affixed to the substrate by means of an anchor 22 such that the bimorph member extends outwardly from the substrate in a stairstep fashion and then extends over the substrate electrode to a distal end 20b. As such, the bimorph member overlies the substrate electrode 14 and the substrate capacitor plate in a cantilevered fashion. The anchor shown in FIGS. 1 and 2 is a simplified rigid anchor that runs across the entire proximal end of the bimorph member and allows for the bimorph member to extend in a cantilevered fashion. This type of anchor is shown by way of example only. Other anchor and suspension structures that serve to establish a point of attachment to the substrate and allow for the predetermined mechanical biasing of the cantilevered portion of the bimorph member (i.e. allowing for the bimorph member to contact the upper layer of the substrate construct) are also possible and within the inventive concepts herein disclosed.

The bimorph member 20 includes first and second layers 24, 26 formed of materials having different coefficients of thermal expansion. Thus, the bimorph member will move in response to changes in temperature relative to the substrate 10 and, therefore, relative to the substrate capacitor plate 18. As shown in FIGS. 1 and 2, the materials are preferably selected such that the bimorph member is curled away from the substrate at a predetermined operating temperature, such as about 77° K, in the absence of an applied voltage. In other words, the distal end 20b of the bimorph member is curled away from the substrate relative to the proximal end 20a of the bimorph member that is affixed to the substrate. Typically, the bimorph member is formed such that the material forming the second layer has a greater coefficient of thermal expansion than the first layer so that the bimorph member curls away from the substrate as the bimorph member cools to the predetermined operating temperature after the first and second layers have been deposited in a plane parallel to the substrate at temperatures greater than the predetermined operating temperature as described below.

For example, in a preferred embodiment the bimorph member 20 of one advantageous embodiment includes a first layer 24 of a first flexible metallic material and a second layer 26 of a second flexible metallic material. In one preferred embodiment the first layer may comprise gold and the second layer may comprise aluminum. Typically, the first and second metal materials will have contrasting thermal coefficients of expansion to allow for biasing in the bimorph structure. Alternatively, the first layer may comprise a dielectric material, such as silicon oxide, silicon nitride or a suitable polymeric material and the second layer may comprise a metallic material, such as gold. The materials chosen for fabricating the bimorph member will characteristically be low electrical resistance materials to allow for operation at high frequencies, such as radio frequencies. Additionally, if the bimorph member provides for a dielectric layer, that material will be capable of providing electrical isolation for the chosen materials that comprise the conductive layer of the bimorph member. Additionally, if HTS materials are used to form the substrate electrode 14 and substrate plate 18 then it is advantageous to choose materials that can be deposited at temperatures that are low enough, such as 250° C. or so, so as not to adversely affect the previously deposited HTS elements.

Although not depicted, the bimorph member 20 can also include an adhesion layer between the first and second layers 24, 26 in order to secure the first and second layers together. Although the adhesion layer can be formed of different materials, the adhesion layer is typically formed of chromium or titanium. Typically, those embodiments that use materials that pose bonding difficulty, such as gold, will require the inclusion of an adhesion layer.

As shown in cross section in FIG. 2, the first layer 24 of the bimorph member 20 in this embodiment forms the anchor 22 that is affixed to the substrate 10 as well as an elongated member that extends outwardly in a cantilevered fashion from the proximal end 20a proximate the anchor and over the substrate electrode 14 and the substrate capacitor plate 18 to the distal end 20b. The second layer 26 of the bimorph member of the embodiment depicted in FIGS. 1 and 2 serves as both the bimorph electrode 28 and a bimorph capacitor plate 30. The first layer can be formed of a flexible metal, a polymeric material, an organic dielectric material or another suitable low loss/low resistance material. The second layer is typically formed of a metallic material, such as aluminum or gold. Regardless of the material that forms the first and second layers, the second layer of the bimorph member of this embodiment is continuous, that is, the second layer of the bimorph member extends from the proximal end 20a to the distal end 20b. In this fashion, the second layer extends continuously over both the substrate electrode 14 and the substrate capacitor plate 18. Nevertheless, the variable capacitor 10 of this embodiment also permits the interelectrode spacing of the substrate electrode and the bimorph electrode (i.e. the second layer) to be varied based upon the voltage differential between the second layer of the bimorph member and the substrate electrode, thereby also correspondingly altering the spacing between the substrate capacitor plate and the second layer of the bimorph member that serves as the bimorph capacitor plate.

Figure 5:
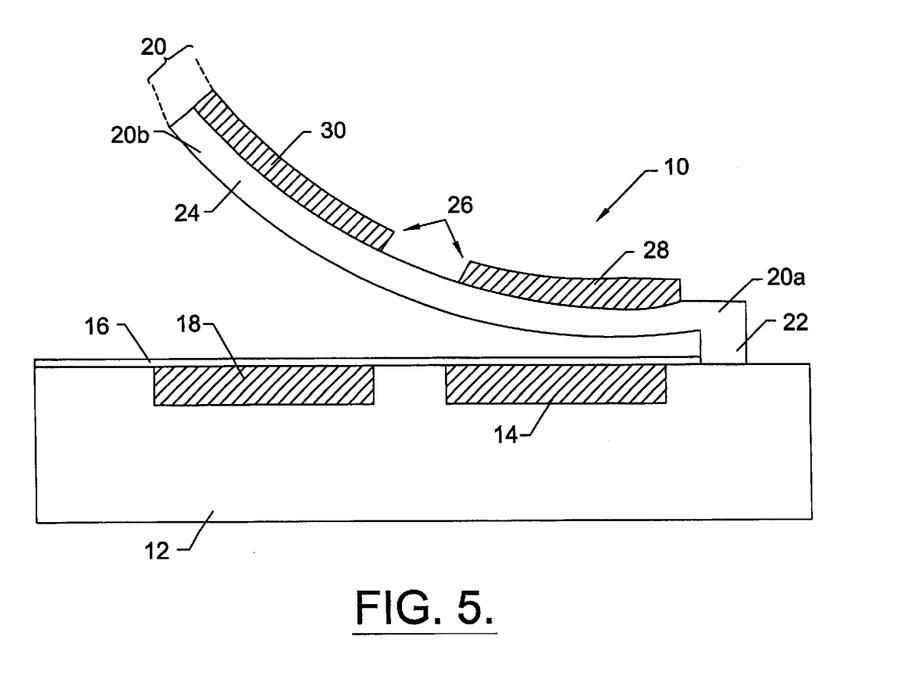
FIG. 5 is a cross-sectional view of a variable capacitor having a bimorph member with a non-continuous second layer having distinct bimorph electrodes(s) and bimorph capacitor plate, in accordance with another embodiment of the present invention.

FIG. 5 shows a cross-sectional view of the variable capacitor 10 having a bimorph electrode 28 and bimorph capacitor plate form the second layer 26 of the bimorph member 20, in accordance with a present embodiment of the present invention. In this embodiment the bimorph electrode and the bimorph capacitor plate are distinct elements that are spaced apart from each other. While the second layer of the bimorph member can include a plurality of distinct bimorph electrodes, the second layer of the bimorph member generally defines the same number of bimorph electrodes as substrate electrodes, such as one bimorph electrode and one substrate electrode in the illustrated FIG. 5 embodiment. The at least one bimorph electrode will be disposed so as to generally align and overlie with corresponding substrate electrode(s). As shown in FIG. 5, the second layer of the bimorph member also defines a distinct bimorph capacitor plate such that the bimorph capacitor plate is spaced from each bimorph electrode and disposed in general alignment with the substrate capacitor plate. In addition, while the bimorph electrode and the bimorph capacitor may have approximately the same size and shape, the bimorph electrode and the bimorph capacitor can have different sizes, shapes and configurations, if so desired. Typically the sizing, shaping and configurations of the bimorph electrodes and bimorph capacitor plate will mirror the sizing, shaping and configuration of the associated substrate electrodes and substrate capacitor plate.

In operation, the spacing between the substrate electrode and second layer/bimorph electrode 14, 26/28 and, in turn, the spacing between the bimorph capacitor plates and the second layer/bimorph capacitor plate 18, 26/30 is controlled by selectively altering the voltages applied to the substrate and bimorph electrodes. In this regard, the voltage differential between the substrate and bimorph electrodes will cause the bimorph member 20 that carries the bimorph electrode to be moved relative to the substrate electrode, thereby altering the interelectrode spacing in a controlled fashion. Since the bimorph capacitor plate is also carried by the bimorph member, any movement of the bimorph member relative to the substrate in response to a voltage differential established between the substrate and bimorph electrodes also controllably varies the spacing between the bimorph capacitor plate and the substrate capacitor plate, thereby also controllably adjusting the resulting capacitance of the variable capacitor 10 of the present invention. Since the capacitance established between a pair of capacitor plates varies according to the inverse of the distance or spacing between the plates, the capacitance of the variable capacitor will increase as the bimorph member is uncurled toward the underlying substrate. Correspondingly, the capacitance of the variable capacitor will decrease as the bimorph member curls further away from the substrate.

By electrically connecting the substrate electrodes and second layer/bimorph electrodes 14, 26/28 to respective electrical leads and the substrate capacitor plate and second layer/bimorph capacitor plates 18, 26/30 to an inductor in a manner known to those skilled in the art, the variable capacitor 10 of the present invention can be used as a tunable filter. By varying the interelectrode spacing and, in turn, the spacing between the substrate and bimorph capacitor plates, the filtering characteristics can be controllably modified. The filter can be configured to pass signals having a predetermined range of frequency, while rejecting signals having frequencies outside the predetermined range (i.e. a bandpass filter) or, alternatively, the filter can be configured to reject a predetermined range of frequency, while passing signals having frequencies outside the predetermined range (i.e. a band-reject filter). Since the substrate electrode and the substrate capacitor are preferably constructed of material (s) that have low electrical resistance for signals having relatively high frequencies, the tunable filter is particularly advantageous for filtering signals having high frequencies, such as signals having radio frequencies. In addition, the low electrical resistance characteristics of the substrate electrode and the substrate capacitor plate will result in a tunable filter that has a high Q, as desired for many applications. The Q factor of the variable capacitors of the present invention and the resulting tunable filter can exceed 2000.

Figure 6A:
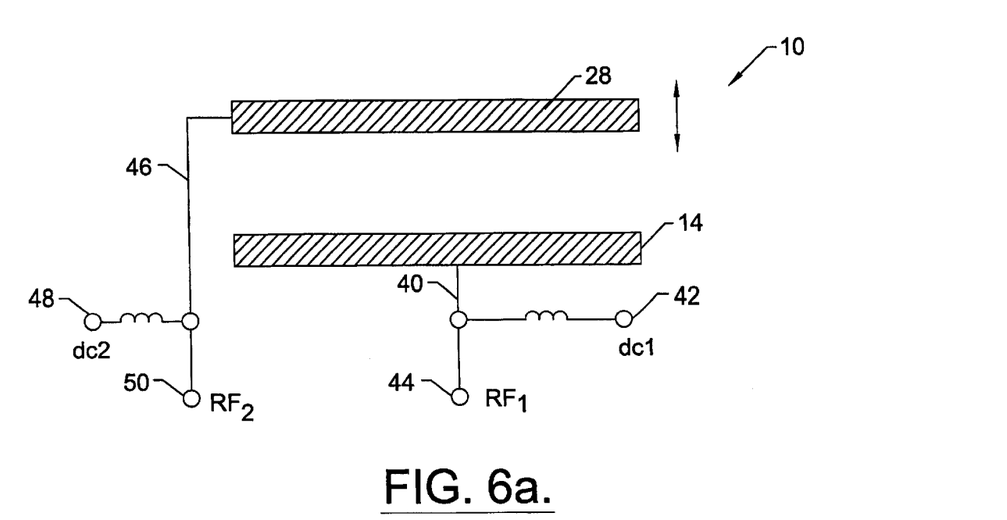
FIGS. 6a–6b are simplified electrical schematics of a two terminal and three terminal variable capacitor, in accordance with embodiments of the present invention.

In the most basic embodiment of the present invention, the variable capacitor is formed as a two-terminal device. FIG. 6a depicts an electrical schematic drawing of a two-terminal variable capacitor 10 having a substrate electrode 14 and bimorph electrode 28 in accordance with an embodiment of the present invention. In this configuration the DC bias and the RF signal share the same leads to the device. The substrate electrode is connected to a first lead 40 that leads to a first DC bias 42 and a first RF signal 44. The bimorph electrode is connected to a second lead 46 that leads to a second DC bias 48 and a second RF signal 50. In this configuration the substrate electrode and the bimorph electrode serve dual roles as the actuation electrode and the capacitor plate electrode. However, in this embodiment when high RF frequencies are encountered during operation the DC bias network has a tendency to interact and degrade the AC signal. In this regard, it is beneficial to implement the variable capacitor of the present invention as a 3 or greater terminal device to increase the relative isolation of the AC signal from the DC bias network.

Figure 6B:
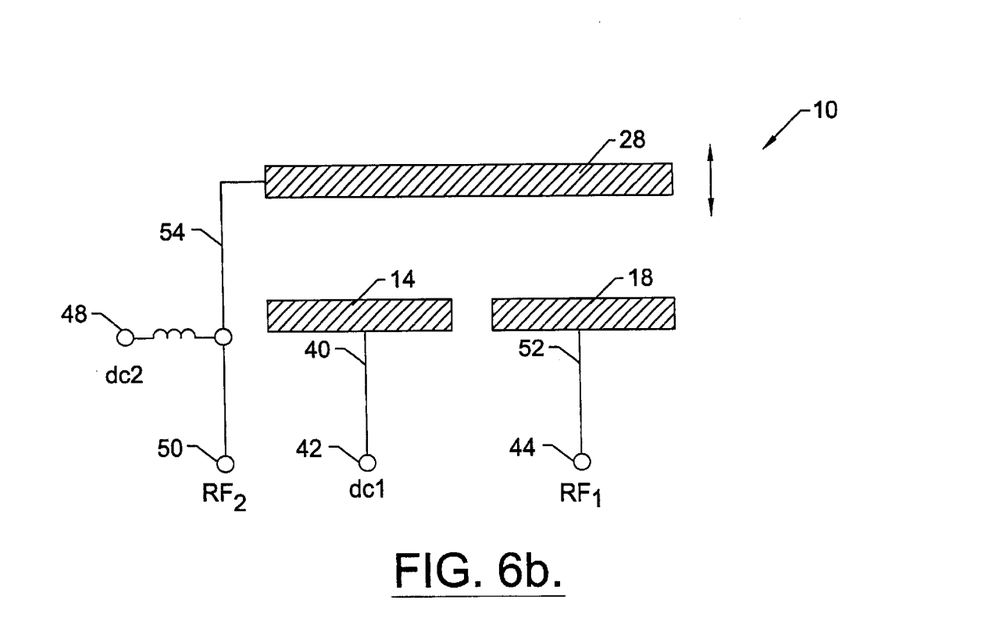

FIG. 6b depicts an electrical schematic of a three-terminal variable capacitor 10 having a substrate electrode 14, a substrate capacitor plate electrode 18 and a bimorph electrode 28 (disposed on the bimorph member) in accordance with an embodiment of the present invention. The substrate electrode is connected to a first lead 40 that leads to a first DC bias 42. The substrate capacitor plate is connected to a second lead 52 that leads to a first RF signal 44. The bimorph electrode is connected to a third lead 54 that leads to a second DC bias 48 and a second RF signal 50; the bimorph electrode is left at a floating potential. It is also possible to implement four or five terminal devices to further increase the relative isolation of the AC signal from the DC bias network. Four and five terminal devices are implemented by further splitting the substrate actuation electrodes and/or capacitor plate electrodes.

The variable capacitor of the present invention may be susceptible to "stiction". Stiction is the term commonly used in the field of MEMS to describe the physical and/or chemical attractive forces that tend to hold two surfaces together in the absence of other secondary forces (i.e. electrostatic force, etc.). Stiction can cause the bimorph member to stick to the substrate electrode and capacitor plate after release of the sacrificial layer during fabrication or after release of the electrostatic force during operation. The in-operation effect may be minimal and manifest itself as hysteresis in performance or the effect may be much more dramatic and cause the bimorph element to remain permanently stuck to the substrate electrode and capacitor plate after the actuation force has been removed.

Figure 7:
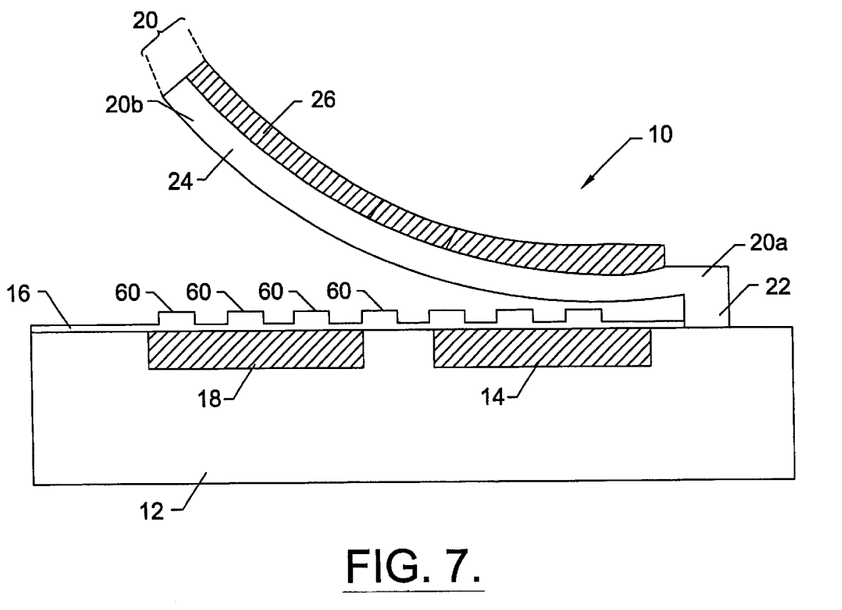
FIG. 7 is a cross-sectional view of a variable capacitor implementing an array of post-like structures to overcome stiction, in accordance with yet another embodiment of the present invention.
Figure 8:
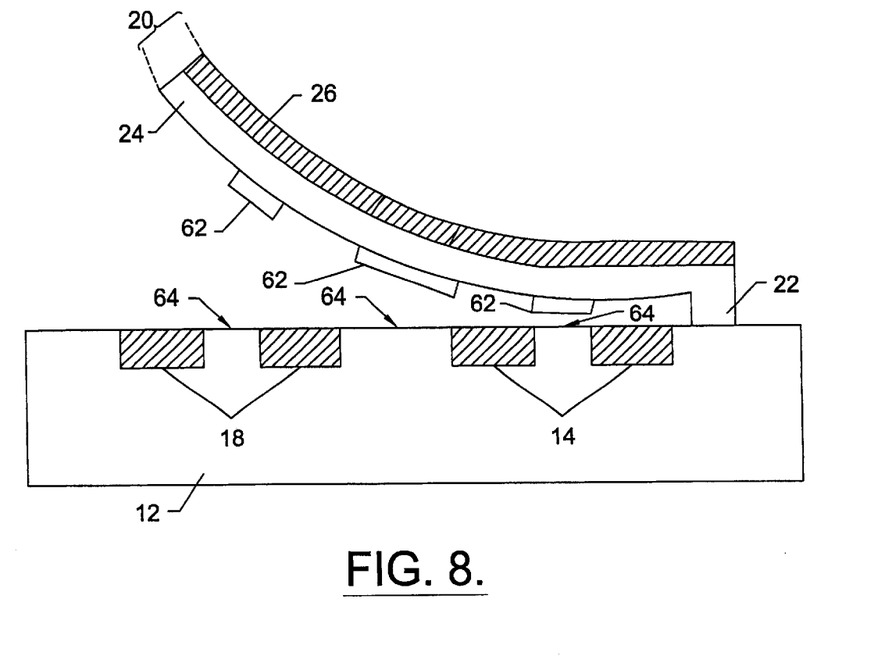
FIG. 8 is a cross-sectional view of a variable capacitor implementing an array of dimples and corresponding islands to overcome stiction, in accordance with another embodiment of the present invention.

FIGS. 7 and 8 illustrate cross-sectional views of two embodiments of the present invention that serve to alleviate the potential problems related to stiction. FIG. 7 is a cross-sectional view of a variable capacitor that implements a protective/dielectric layer 16 that forms an array of post-like structures 60. The protective/dielectric layer is disposed on the microelectronic substrate 12, the countersunk substrate electrode 14 and the countersunk substrate capacitor plate 18. The post-like structures are formed by subjecting a continuous protective/dielectric layer to a pattern and etch process. In embodiments in which the substrate electrode and/or the substrate capacitor plate comprise an HTS material, the post-like structures may be formed of a polymeric material or another similar material providing subsequent processing protection to the HTS and electrical isolation to the substrate electrode and capacitor plate. In embodiments in which the substrate electrode and the substrate capacitor plate are formed of non-HTS materials, such as a thick metal layer, the post-like structures may be formed of an oxide material, a nitride material or another suitable dielectric insulating material. The post-like structures are formed to subjecting the protective layer to a conventional pattern and etch process prior to disposing a sacrificial layer (not shown in FIG. 6) on the protective layer. The post-like structures serve to decrease the amount of surface area that the bimorph member 20 contacts when the bimorph member is attracted to the substrate electrode. By providing for less contact area between the bimorph member and the substrate structures, it is possible to lessen the effects of stiction.

FIG. 8 is a cross-sectional view of a variable capacitor 10 that implements an array of dimples 62 on the bimorph member 20 and a corresponding array of islands 64 on the substrate 12 in accordance with an embodiment of the present invention. An array of dimples (small protrusions) are formed on the underside of the bimorph member nearest the microelectronic substrate (i.e. the exposed surface of the first layer 24). The dimples serve to provide texturing to the underside of the bimorph member. The dimples are typically formed during the same process step that provides for the first layer. Therefore, the dimples typically comprise a dielectric insulator, such as a nitride material, an oxide material or another material capable of providing electrical isolation. In fabrication, the dimples are typically formed by patterning and etching a secondary sacrificial layer (not shown in FIG. 8) that forms a mold of where dimples are to be made in the subsequently disposed first layer of the bimorph member. The islands are surfaces on the substrate that correspond to the dimples in the bimorph member. The islands serve as resting places for the dimples when the bimorph member is actuated toward the substrate. In the embodiment shown the islands exist within the countersunk electrode and capacitor plate and between the electrode and capacitor plate. By providing for a resting place, the dimple to island interface creates the necessary gap between the substrate electrode/substrate capacitor plate and the bimorph member to thereby prevent shorting.

Figure 9A:
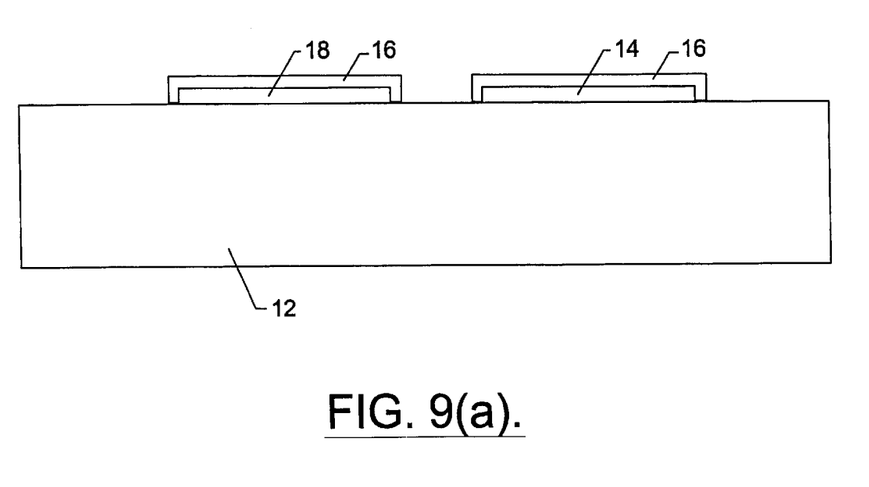
FIGS. 9a–9d are cross-sectional views illustrating the sequential operations performed during the fabrication of a HTS variable capacitor according to one embodiment to the present invention.
Figure 9B:
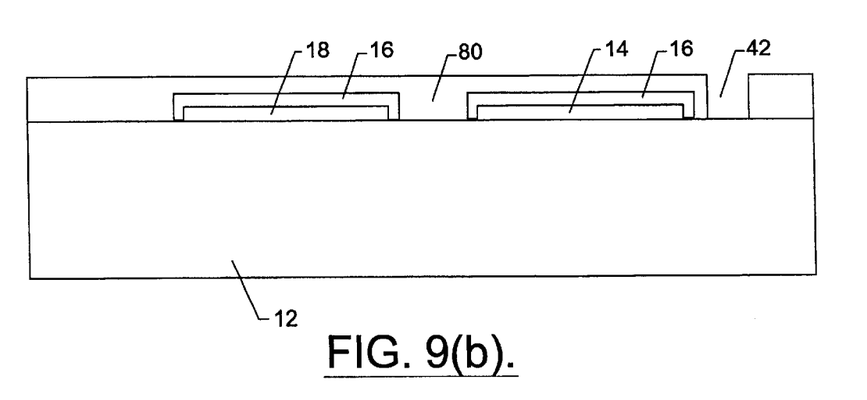
Figure 9C:
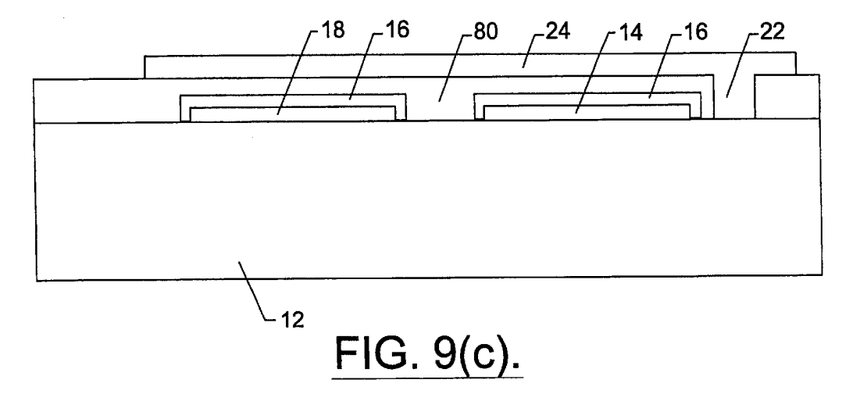

A method is also provided according to another aspect of the present invention for fabricating a variable capacitor 10, such as described above in conjunction with FIGS. 1–2. Various stages of the variable capacitor fabrication process are depicted in the cross-sectional views of FIGS. 9a–9d, in accordance with an embodiment of the present invention. This method details the processing involved in fabricating a variable capacitor having a substrate electrode and capacitor plate formed from an HTS material. In this regard, a layer of HTS material, such as YBCO or TBCCO, is initially deposited upon a substrate 12, such as a substrate formed of MgO, LaAlO$_3$ or NdCaAlO$_4$ or other substrate materials compatible with HTS materials. The HTS material is then patterned; such as by ion milling, to define at least one substrate electrode 14 and a substrate capacitor plate 18, spaced from the substrate electrode. Thereafter, the substrate electrode and the substrate capacitor plate are preferably coated with a dielectric layer 16, such as a protective film formed of polyimide, or a similar protective film capable of providing an insulating means to the variable capacitor. Although the dielectric layer can be deposited in different manners, typically, the dielectric layer is spun on and then reactive ion etched to produce the intermediate structure in which the substrate electrode and the substrate capacitor plate are each coated with a protective film as shown in FIG. 9a. Alternatively, a photoimagable protective film can be utilized such that the layer need not be reactive ion etched, but can be patterned by conventional photolithographic techniques.

According to the method of this aspect of the present invention, the intermediate structure is then coated with a sacrificial layer 80 of a low temperature oxide, such as silicon dioxide. Low temperature oxide is utilized to avoid exposing the HTS material that forms the substrate electrode 14 and the substrate capacitor plate 18 to high temperatures (>about 300 degrees Celsius) that could damage the HTS material. In this regard, the low temperature oxide is generally deposited, such as by Plasma Enhanced Chemical Vapor Deposition (PECVD), at a temperature of about 250° C. to about 300° C. The low temperature oxide is then patterned and etched to open a window 42 to the substrate 12 in which the anchor 22 of the bimorph member 20 will subsequently be formed. See, for example, FIG. 9b. The first layer 24 of the bimorph member is then formed upon the sacrificial layer. For example, a layer of gold, polymeric material or another suitable dielectric material, can be spun onto the sacrificial layer. The first layer may then be etched by means of reactive ion etching and annealed to form the structure shown in FIG. 9c.

Figure 9D:
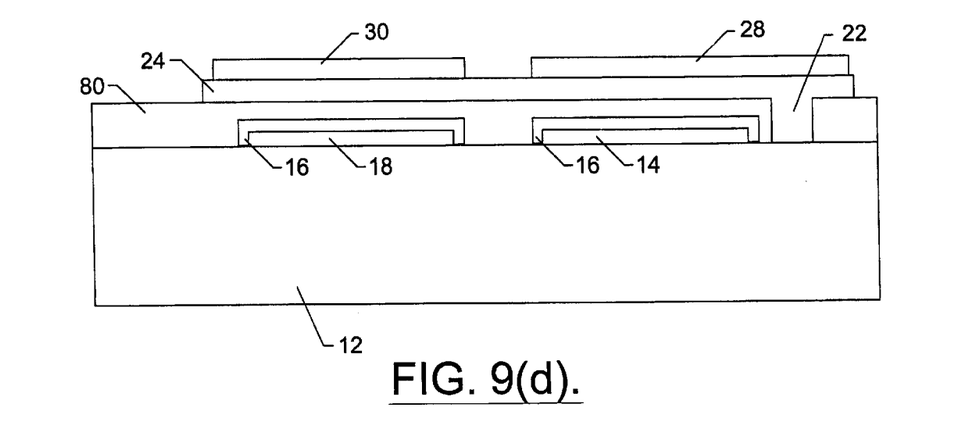

The second layer 26 of the bimorph member 20 can then be deposited on the first layer 24. Although the second layer, as shown, can be a continuous layer the second layer can alternatively be divided into regions that separately define the bimorph electrode and the bimorph capacitor plate. In this embodiment, the metallic material, such as aluminum, that forms the second layer of the bimorph member can be deposited, typically, using conventional deposition techniques and the intermediate structure depicted in FIG. 9d is produced. By thereafter etching the sacrificial layer 80, such as with hydrofluoric (HF) acid, the sacrificial layer is removed and the distal end 20b of the bimorph member is freed so as to curl away from the substrate 12 as shown in FIGS. 1 and 2.

Although not depicted in FIGS. 9a–9d, the fabrication method of the present invention can include the deposition of an adhesion layer upon the first layer 24 of the bimorph member 20 prior to depositing the second layer 26. Preferably, the adhesion layer is formed of a material such as chromium or titanium that is patterned to have the same shape and size as the second layer. For example, the variable capacitor 10 of the embodiment depicted in FIGS. 1 and 2 could have an adhesion layer deposited upon the first layer and the second layer can be deposited upon the adhesion layer in the manner described above. As a result of disposing an adhesion layer between the first and second layers of bimorph member, the second layer can be more robustly adhered to the first layer, particularly in instances in which the selection of materials for the first and second layers of the bimorph member would otherwise dictate that the second layer would not robustly adhere to the first layer. One such example in which an adhesion layer may be desirable is instances in which first layer of the bimorph member is formed of gold and the second layer of the bimorph member is formed of aluminum.

Figure 10A:
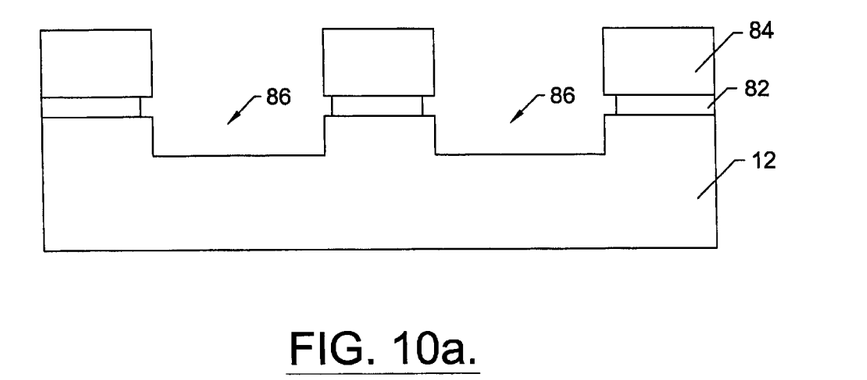
FIGS. 10a–10b are cross-sectional views illustrating the sequential operations performed during the fabrication of countersunk electrodes and capacitor plates in a non-HTS variable capacitor, in accordance with an embodiment of the present invention.
Figure 10B:
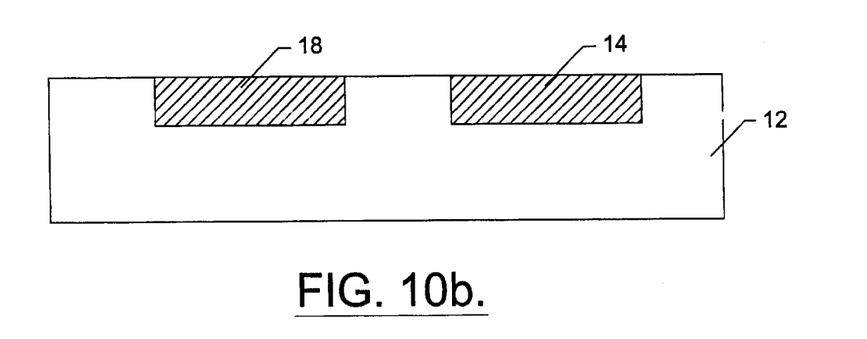

An alternative method for fabricating a variable capacitor having substrate electrode and substrate capacitor plate formed from non-HTS material is shown in the cross-sectional views of FIGS. 10a–10b illustrating various processing stages, in accordance with an embodiment of the present invention. In this regard, a thick layer of metal, such as gold is initially countersunk into the substrate. The substrate may comprise quartz, GaAs, or other suitable substrate materials. FIG. 10a illustrates the substrate 12 having a layer of poly-silicon material 82 and a layer of photoresist 84 disposed thereon. The photoresist material is exposed and developed to define those regions on the substrate where trenches will be fabricated. After development of the photo resist the poly-silicon layer and the substrate are etched away to define the trenches 86. In FIG. 10b, metal has been disposed in the trenches to form the countersunk substrate electrode 14 and the countersunk substrate capacitor plate 18 and the remaining photoresist and poly-silicon has been stripped away. An optional planarization process may be performed to planarize the substrate and the countersunk substrate electrode and capacitor plate. The remainder of the fabrication of the non-HTS variable capacitor is typically performed using the processing steps previously discussed starting with disposing a protective/dielectric layer on the countersunk elements and substrate.

In any event, the fabrication methods of this aspect of the present invention provides efficient and repeatable techniques for fabricating variable capacitors 10 utilizing micromachining techniques while including elements, such as electrodes and capacitor plates, formed of low electrical resistance materials. As such, the resulting variable capacitor will have relatively low loss and, consequently, a relatively high Q. The variable capacitors can therefore be used in applications that demand high Q, such as tunable filters for high frequency applications as described above.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A microelectromechanical system (MEMS) variable capacitor comprising:
    a substrate;
    at least one substrate electrode disposed upon said substrate, said at least one substrate electrode comprising a low electrical resistance material; and
    a bimorph member extending outwardly from said substrate and over said at least one substrate electrode, said bimorph member comprising first and second layers formed of materials having different coefficients of thermal expansion, said bimorph member comprising at least one bimorph electrode such that a voltage differential established between said at least one substrate electrode and said at least one bimorph electrode further moves said bimorph member relative to said at least one substrate electrode to thereby alter an interelectrode spacing.

2. A MEMS variable capacitor according to claim 1, further comprising a substrate capacitor plate disposed upon said substrate, wherein said bimorph member further comprises a bimorph capacitor plate that moves in response to the voltage differential between said at least one substrate electrode and said at least one bimorph electrode to thereby correspondingly alter the capacitance between the substrate capacitor plate and the bimorph capacitor plate.

3. A MEMS variable capacitor according to claim 1, further comprising a dielectric element disposed between said substrate electrode and said bimorph electrode, wherein the dielectric element provides for electrical isolation between the substrate electrode and said bimorph electrode.

4. A MEMS variable capacitor according to claim 2, further comprising at least one dielectric element disposed between said substrate electrode and said bimorph electrode and disposed between said substrate capacitor plate and said bimorph capacitor plate, wherein the at least one dielectric element provides for electrical isolation between the substrate electrode and bimorph electrode and for electrical isolation between the substrate capacitor plate and the bimorph capacitor plate.

5. A MEMS variable capacitor according to claim 2, wherein said substrate capacitor plate comprises a low electrical resistance material.

6. A MEMS variable capacitor according to claim 2, wherein said at least one substrate electrode and said substrate capacitor plate are each comprised of a High Temperature Superconducting (HTS) material.

7. A MEMS variable capacitor according to claim 6, wherein said at least one substrate electrode and said substrate capacitor plate are each comprised of Yttrium Barium Copper Oxide (YBCO).

8. A MEMS variable capacitor according to claim 6, wherein said at least one substrate electrode and said substrate capacitor plate are each comprised of Thallium Barium Calcium Copper Oxide (TBCCO).

9. A MEMS variable capacitor according to claim 5, wherein said at least one substrate electrode and said substrate capacitor plate are each comprised of a metal having a thickness at least two times (2x) the skin depth of the traversing signal at the frequency of operation.

10. A MEMS variable capacitor according to claim 9 wherein said at least one substrate electrode and said substrate capacitor plate are each comprised of gold having a thickness at least two times (2x) the skin depth of the traversing signal at the frequency of operation.

11. A MEMS variable capacitor according to claim 2 wherein the first and second layers of said bimorph member are each continuous layers such that the continuous second layer serves as both the at least one bimorph electrode and the bimorph capacitor plate.

12. A MEMS variable capacitor according to claim 2 wherein the second layer of said bimorph member comprises the at least one bimorph electrode disposed in general alignment with at least one substrate electrode and the bimorph capacitor plate spaced from the at least one bimorph electrode and disposed in general alignment with the substrate capacitor plate.

13. A MEMS variable capacitor according to claim 1 wherein said bimorph member is curled away from said substrate at a predetermined operating temperature in the absence of an applied voltage.

14. A MEMS variable capacitor according to claim 1 wherein the first layer of said bimorph member comprises gold, and wherein the second layer of said bimorph member comprises aluminum.

15. A MEMS variable capacitor according to claim 1 wherein the first layer of said bimorph member comprises polymeric material, and wherein the second layer of said bimorph member comprises a metal.

16. A MEMS variable capacitor according to claim 1 wherein the first layer of said bimorph member comprises a nitride material, and wherein the second layer of said bimorph member comprises a metal.

17. A MEMS variable capacitor according to claim 1 wherein the first layer of said bimorph member comprises an oxide material, and wherein the second layer of said bimorph member comprises a metal.

18. A MEMS variable capacitor according to claim 2, wherein said at least one substrate electrode and said substrate capacitor plate are countersunk into the substrate.

19. A MEMS variable capacitor according to claim 1, further comprising post-like structures disposed on the substrate, wherein the post-like structures serve to impede stiction.

20. A MEMS variable capacitor according to claim 1, further comprising dimples disposed on an underside of the bimorph member nearest the substrate and corresponding islands disposed on the substrate, wherein the dimples and islands serve to impede stiction.

21. A MEMS variable capacitor comprising:

a substrate;

a substrate capacitor plate disposed upon said substrate, said substrate capacitor plate comprising a low electrical resistance material;

at least one substrate electrode disposed upon said substrate and spaced from said substrate capacitor plate, said at least one substrate electrode comprising a low electrical resistance material;

a bimorph member extending outwardly from said substrate and over said at least one substrate electrode, said bimorph member comprising a bimorph capacitor plate and at least one bimorph electrode; and at least one dielectric element disposed between substrate electrode and bimorph electrode and disposed between the substrate capacitor plate and the bimorph capacitor plate, wherein a voltage differential established between said at least substrate electrode and said at least one bimorph electrode moves said bimorph member relative to said substrate to thereby alter the spacing between said substrate capacitor plate and said bimorph capacitor plate.

22. A MEMS variable capacitor according to claim 21 wherein said at least one substrate electrode and said substrate capacitor plate are each comprised of a HTS material.

23. A MEMS variable capacitor according to claim 21, wherein said at least one substrate electrode and said substrate capacitor plate are each comprised of Yttrium Barium Copper Oxide (YBCO).

24. A MEMS variable capacitor according to claim 21, wherein said at least one substrate electrode and said substrate capacitor plate are each comprised of Thallium Barium Calcium Copper Oxide (TBCCO).

25. A MEMS variable capacitor according to claim 21, wherein said at least one substrate electrode and said substrate capacitor plate are each comprised of a metal having a thickness at least two times (2×) the skin depth of the traversing signal at the frequency of operation.

26. A MEMS variable capacitor according to claim 25 wherein said at least one substrate electrode and said substrate capacitor plate are each comprised of gold having a thickness at least two times (2×) the skin depth of the traversing signal at the frequency of operation.

27. A MEMS variable capacitor according to claim 21 wherein said bimorph member comprises first and second layers formed of materials having different coefficients of thermal expansion such that said bimorph member is curled away from said substrate at a predetermined operating temperature in the absence of an applied voltage.

28. A MEMS variable capacitor according to claim 27 wherein the first and second layers of said bimorph member are each continuous layers such that the continuous second layer serves as both the at least one bimorph electrode and the bimorph capacitor plate.

29. A MEMS variable capacitor according to claim 27 wherein the second layer of said bimorph member comprises the at least bimorph electrode disposed in general alignment with the at least one substrate electrode, and the bimorph capacitor plate spaced from the at least one bimorph electrode and disposed in general alignment with the substrate capacitor plate.

30. A variable capacitor according to claim 27 wherein the first layer of said bimorph member comprises gold, and wherein the second layer of said bimorph member comprises aluminum.

31. A variable capacitor according to claim 27 wherein the first layer of said bimorph member comprises a polymeric material, and wherein the second layer of said bimorph member comprises a metal.

32. A MEMS variable capacitor according to claim 1 further comprising:

an anchor between the bimorph member and the substrate that is configured to mechanically bias the bimorph member to contact the substrate.

33. A MEMS variable capacitor according to claim 21 further comprising:

an anchor between the bimorph member and the substrate that is configured to mechanically bias the bimorph member to contact the substrate.

* * * * *